United States Patent [19]
Fujita et al.

[11] Patent Number: 5,336,915
[45] Date of Patent: Aug. 9, 1994

[54] SEMICONDUCTOR INTEGRATED CIRCUIT DEVICE HAVING ANALOG CIRCUIT AND DIGITAL CIRCUIT FORMED ON ONE CHIP

[75] Inventors: Yasuhiko Fujita, Kanagawa; Haruyuki Miyata, Yokohama, both of Japan

[73] Assignee: Kabushiki Kaisha Toshiba, Kawasaki, Japan

[21] Appl. No.: 814,802

[22] Filed: Dec. 31, 1991

[30] Foreign Application Priority Data

Jan. 9, 1991 [JP] Japan .................. 3-1232

[51] Int. Cl.$^5$ .................. H01L 29/784; H01L 27/02
[52] U.S. Cl. .................. 257/369; 257/371; 257/372; 257/500
[58] Field of Search .................. 257/500, 534, 528, 368, 257/369, 370, 372, 371, 328, 531, 369

[56] References Cited

U.S. PATENT DOCUMENTS

| | | | |
|---|---|---|---|
| 3,748,545 | 7/1973 | Beale | 257/372 |
| 4,980,746 | 4/1989 | Harrington, III | 257/369 |
| 5,023,688 | 12/1989 | Ando et al. | 257/350 |
| 5,047,358 | 9/1991 | Kosiak et al. | 257/369 |
| 5,239,197 | 8/1993 | Yamamoto | 257/369 |

FOREIGN PATENT DOCUMENTS

| | | | |
|---|---|---|---|
| 0319047 | 6/1989 | European Pat. Off. | 257/369 |
| 285463 | 11/1987 | Japan | 257/371 |
| 62-58668 | 12/1987 | Japan . | |
| 58668 | 12/1987 | Japan . | |
| 77153 | 3/1990 | Japan . | |
| 110963 | 4/1990 | Japan . | |
| 110964 | 4/1990 | Japan . | |
| 0310961 | 12/1990 | Japan | 257/369 |

OTHER PUBLICATIONS

Meyer et al., "Integrable High Voltage CMOS: Devices, Process Application", IEDM 85 (IEEE) 30.3, pp. 732-735 (1985).

*Primary Examiner*—Rolf Hille
*Assistant Examiner*—Alexander Oscar Williams
*Attorney, Agent, or Firm*—Finnegan, Henderson, Farabow, Garrett & Dunner

[57] ABSTRACT

First and second well regions of a second conductivity type are formed in a semiconductor substrate of a first conductivity type. An analog circuit is formed in the first well region. A digital circuit is formed in the second well region.

7 Claims, 5 Drawing Sheets

SEMICONDUCTOR INTEGRATED CIRCUIT DEVICE HAVING ANALOG CIRCUIT AND DIGITAL CIRCUIT FORMED ON ONE CHIP

BACKGROUND OF THE INVENTION

1. Field of the Invention

This invention relates to a semiconductor integrated circuit device having an analog circuit and a digital circuit formed on one chip, and more particularly, to a semiconductor integrated circuit device capable of suppressing mutual interference between an analog circuit section and a digital circuit section caused by noise.

2. Description of the Related Art

A method of suppressing the mutual interference caused by noise in a semiconductor integrated circuit device is disclosed in Japanese Patent Publication No. 62-58668. In a C-MOS integrated circuit described in the above Japanese Patent Publication, for example, an analog circuit section is formed in an N-type semiconductor substrate and a P-type well region. On the other hand, a digital circuit section is formed in the N-type semiconductor substrate and another P-type well region. A P-type well region for noise absorption is formed in that part of the substrate which lies between the above circuit sections. The P-type well region for noise absorption is applied with a constant potential, for example, a ground potential. With the above construction, noise generated from the analog circuit section or digital circuit section is absorbed by the noise absorption well region. The transmission path for noise is cut off by the noise absorption well region and thus the mutual interference between the analog circuit and the digital circuit caused by noise can be suppressed.

However, in recent years, it has been known that noise is transmitted not only along the surface area of the semiconductor substrate, but also in a deep portion of the semiconductor substrate. With the construction disclosed in the above Japanese Patent Publication, since the noise absorption well region is formed in the surface area of the semiconductor substrate, noise which is transmitted in the deep portion of the semiconductor substrate cannot be sufficiently cut off.

SUMMARY OF THE INVENTION

Accordingly, an object of this invention is to provide a semiconductor integrated circuit device capable of stably cutting off not only noise which is transmitted along the surface area of the semiconductor substrate but also noise which is transmitted in the deep portion of the semiconductor substrate.

The above object can be attained by a semiconductor integrated circuit device comprising a semiconductor substrate of a first conductivity type; a first well region of a second conductivity type formed in the semiconductor substrate; and a second well region of the second conductivity type which is formed in the semiconductor substrate in a position separated from the first well region and in which an analog circuit is formed.

With the above construction, since the first and second well regions are surrounded by the semiconductor substrate, the circuit formed in the first well region and the analog circuit formed in the second well region can be electrically isolated from each other not only in the surface area of the semiconductor substrate but also in the deep portion of the semiconductor substrate. Since the semiconductor substrate acts to absorb noise, noise generated from the circuit formed in one of the well regions can be absorbed in the semiconductor substrate and will be prevented from being transmitted to the other well region. As a result, the mutual interference between the circuit formed in the first well region and the analog circuit formed in the second circuit can be suppressed. Thus, a semiconductor integrated circuit device capable of stably cutting off not only noise transmitted along the surface area of the semiconductor substrate but also noise transmitted in the deep portion of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
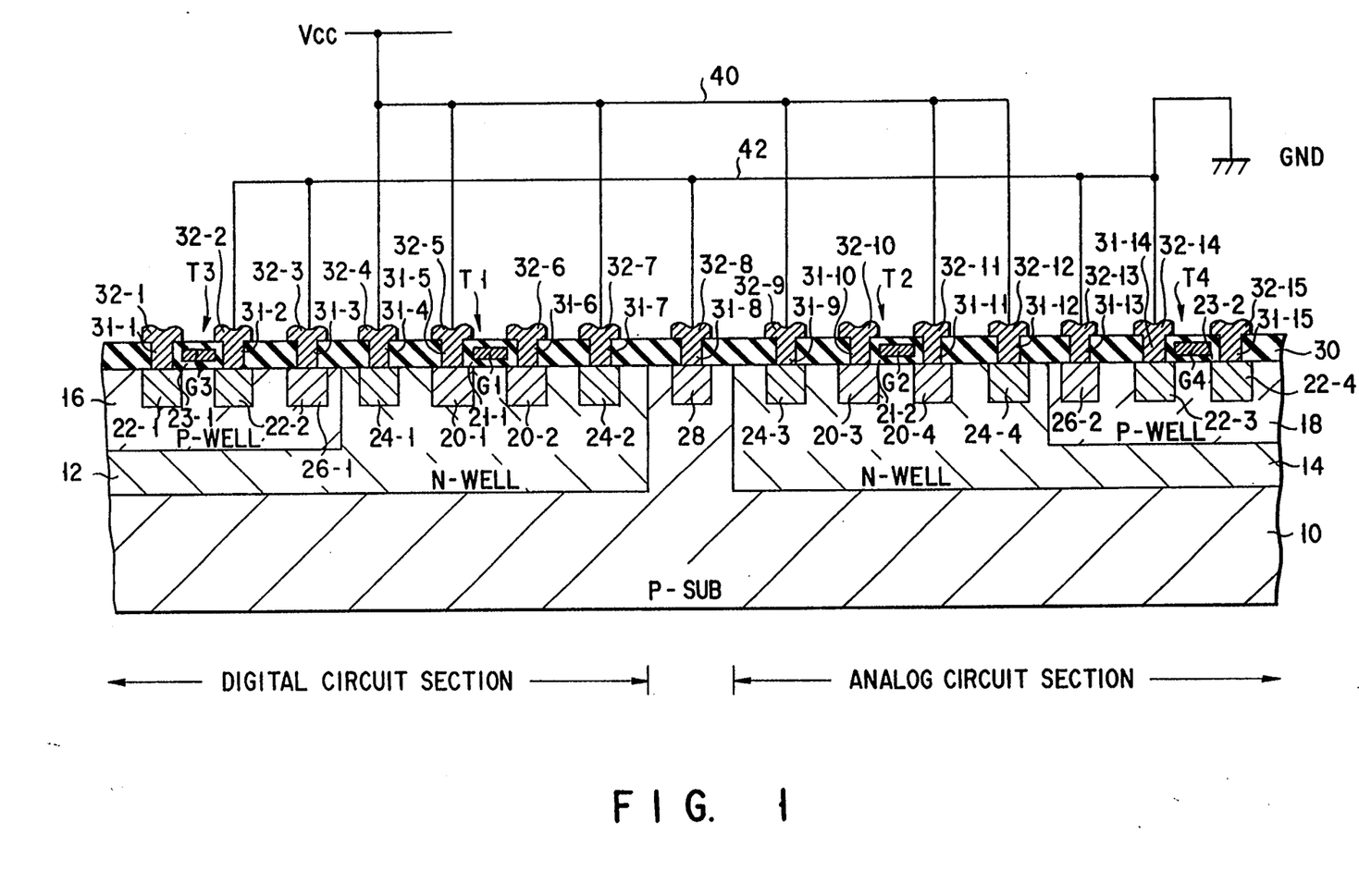
FIG. 1 is a cross sectional view showing the schematic construction of a semiconductor integrated circuit device according to a first embodiment of this invention.

FIG. 1 shows the schematic construction of a semiconductor integrated circuit device according to a first embodiment of this invention and having an analog circuit and a digital circuit formed on one chip.

A first N-type well region 12 and a second N-type well region 14 are separately formed in a P-type semiconductor substrate 10. A digital circuit is formed in the first N-type well region 12 and an analog circuit is formed in the second N-type well region 14. A P-type well region 16 is formed in the first N-type well region 12 and a P-type well region 18 is formed in the second N-type well region 14, thereby permitting the CMOS circuit construction to be formed in both the digital circuit section and the analog circuit section. P-type semiconductor regions 20-1, 20-2 and 20-3, 20-4 are respectively formed in the N-type well regions 12 and 14. N-type semiconductor regions 22-1, 22-2 and 22-3, 22-4 are respectively formed in the P-type well regions 16 and 18. The regions 20-1 to 20-4 and 22-1 to 22-4 are used to form active elements, and in the device of FIG. 1, MOSFETs T1 to T4 are formed as the active elements. That is, a gate insulation film 21-1 is formed on that portion of the N-type well region which lies between the semiconductor regions 20-1 and 20-2 and a gate electrode G1 is formed on the gate insulation film 21-1 so as to form the MOSFET T1. A gate insulation film 21-2 is formed on that portion of the N-type well region which lies between the semiconductor regions 20-3 and 20-4 and a gate electrode G2 is formed on the gate insulation film 21-2 so as to form the MOSFET T2. A gate insulation film 23-1 is formed on that portion of the P-type well region which lies between the semiconductor regions 22-1 and 22-2 and a gate electrode G3 is formed on the gate insulation film 23-1 so as to form the MOSFET T3. A gate insulation film 23-2 is formed on that portion of the P-type well region which lies between the semiconductor regions 22-3 and 22-4 and a gate electrode G4 is formed on the gate insulation film 23-2 so as to form the MOSFET T4.

Further. N-type semiconductor regions 24-1 to 24-4 having an impurity concentration higher than the well regions 12 and 14 are formed in the N-type well regions 12 and 14. The semiconductor regions 24-1 to 24-4 are used to apply a bias potential to the well regions 12 and 14. Likewise, P-type semiconductor regions 26-1 and 26-2 of higher impurity concentration for applying a bias potential are formed in the P-type well regions 16 and 18. A P-type semiconductor region 28 having an impurity concentration higher than the semiconductor substrate 10 is formed apart from the N-type well regions 12 and 14 in that portion of the surface area of the semiconductor substrate 10 which lies between the first and second N-type well regions 12 and 14. The region 28 is used to apply a bias potential to the substrate 10.

An insulation film 30 is formed on the main surface of the substrate 10 and contact holes 31-1 to 31-15 are formed in those portions of the insulation film 30 which lie on the semiconductor regions 22-1, 22-2, 26-1, 24-1, 20-1, 20-2, 24-2, 28, 24-3, 20-3, 20-4, 24-4, 26-2, 22-3 and 22-4. Conductive layers 32-1 to 32-5 formed of aluminum and used as wirings or electrodes, for example, are formed on the insulation film 30 and in the contact holes 31-1 to 31-15. A power source Vcc is connected to the conductive layers 32-4, 32-5, 32-7, 32-9, 32-11 and 32-12 via a wiring 40 and a ground potential line GND is connected to the conductive layers 32-2, 32-3, 32-8, 32-13 and 32-14 via a wiring 42. Wirings are connected to the conductive layers 32-1, 32-6 , 32-10 and 32-15, whose connection state is not shown, to attain a desired circuit function.

with the above construction, the N-type well regions 12 and 14 are formed in the substrate 10, the digital circuit section is formed in the well regions 12 and 16, and the analog circuit section is formed in the well regions 14 and 18, and the digital circuit section and the analog circuit section are electrically isolated from each other by means of the substrate 10 which is grounded. That is, the semiconductor substrate 10 is not used as a region for constituting an active element and all of the active elements are formed in the well regions 12 and 14 and in the well regions 16 and 18 which are formed in the well regions 12 and 14. The substrate 10 is used as a region for absorbing noise. Therefore, noise generated in the digital circuit section or analog circuit section can be absorbed by those portions of the substrate 10 which lie around the well regions 12 and 14. As a result, not only noise transmitted on the surface area of the substrate 10 but also noise transmitted in the deep portion of the substrate 10 can be effectively cut off. Thus, electrical noise generated in the digital circuit section can be stably prevented from being transmitted to the analog circuit section or electrical noise generated in the analog circuit section can be stably prevented from being transmitted to the digital circuit section.

Figure 2:
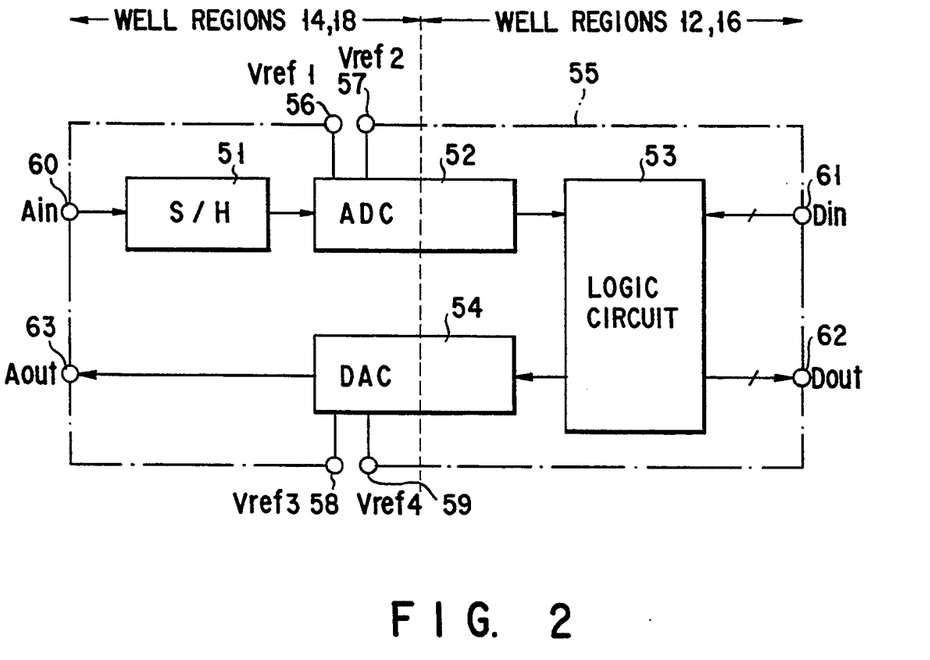
FIG. 2 is a block diagram showing an example of a circuit of a semiconductor integrated circuit device to which this invention is applied and which has an analog circuit and a digital circuit formed on one chip.

FIG. 2 is a block diagram showing an example of a circuit of a semiconductor integrated circuit device having an analog circuit and a digital circuit formed on one chip according to this invention. The circuit includes a sample-and-hold circuit (S/H) 51, analog/digital converter (ADC) 52, logic circuit 53 and digital-/analog converter (DAC) 54 and the like formed on one chip 55. The converter 52 has terminals 56 and 57 which are applied with reference potentials Vref1 and Vref2 for the operation thereof. The converter 54 has terminals 58 and 59 which are applied with reference potentials Vref3 and Vref4 for the operation thereof. An analog input signal Ain input to an input terminal 60 is supplied to the sample-and-hold circuit 51 and sampled and held in the circuit 51. Data (analog input signal Ain) held in the sample-and-hold circuit 51 is supplied to the analog/digital converter 52 and converted to digital data corresponding to the analog input signal Ain. Digital data output from the converter 52 is supplied to the logic circuit 53. The logic circuit 53 is also supplied with a digital input signal Din used for logic operation from an input terminal 61 and a preset logic operation is effected by use of the signal Din and the digital signal output from the converter 52. The operation result is output from an output terminal 62 as a digital output signal Dout. Alternatively, the operation result is supplied to the digital/analog converter 54 and converted to analog data. The analog data output from the converter 54 is output from an output terminal 63 as an analog output signal Aout. Further, it is also possible to subject the digital input signal Din supplied from the input terminal 61 to the logic circuit 53 to the preset operation by use of the logic circuit 53, convert the digital input signal to an analog signal by means of the converter 54 and output the thus converted analog signal as an analog output signal Aout from the output terminal 63 instead of using the output of the converter 52.

with the above construction, the analog circuit section, that is, the sample-and-hold circuit 51, part of the analog/digital converter 52 and part of the digital-/analog converter 54 are formed in the well regions 14 and 18. The digital circuit section, that is, the remaining portion of the analog/digital converter 52, the remaining portion of the digital/analog converter 54 and the logic circuit 53 are formed in the well regions 12 and 16.

Figure 3:
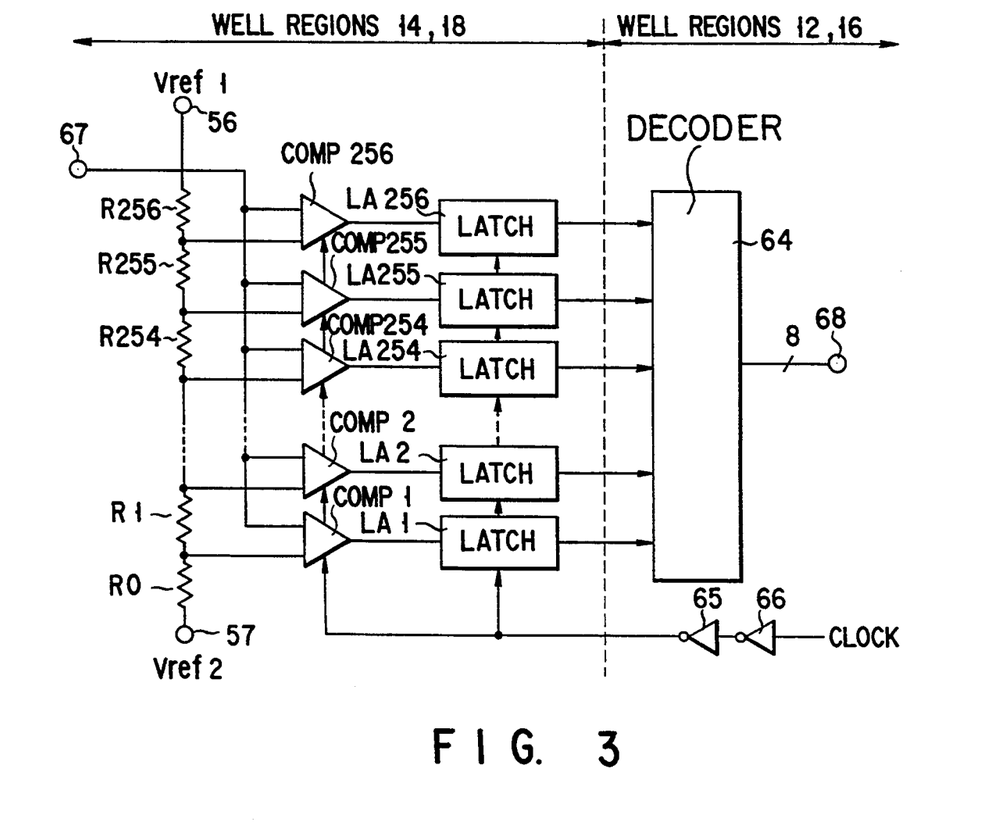
FIG. 3 is a circuit diagram showing an example of the construction of an analog/digital converter in the circuit shown in FIG. 2.

FIG. 3 shows an example of the construction of the analog/digital converter 52 in the circuit of FIG. 2 and shows a so-called Flash ADC circuit construction. The ADC is constructed by resistors R0 to R256, comparators COMP1 to COMP256, latch circuits LA1 to LA256, decoder 64, and inverters 65 and 66. The resistors R0 to R256 are serially connected between the terminals 56 and 57 to which the reference potentials Vref1 and Vref2 are respectively applied. The comparators COMP1 to COMP256 are respectively connected at one-side input terminals thereof to a connection node between the resistors R0 and R1, ---, a connection node between the resistors R253 and R254, a connection node between the resistors R254 and R255, and a connection node between the resistors R255 and R256. The comparators COMP1 to COMP256 are connected at the other-side input terminals thereof to an input terminal 67 (output terminal of the sample-and-hold circuit 51). The output terminals of the comparators COMP1 to COMP256 are connected input terminals of the latch circuits LA1 to LA256. Clock signals are supplied to the comparators COMP1 to COMP256 and latch circuits LA1 to LA256 via inverters 65 and 66 and the comparators COMP1 to COMP256 and latch circuits LA1 to LA256 are synchronously operated. The output terminals of the latch circuits LA1 to LA256 are connected to the input terminal of the decoder 64. The decoder 64 outputs 8-bit digital data from an output terminal 68 thereof.

The resistors R0 to R256, comparators COMP1 to COMP256 and latch circuits LA1 to LA256 are formed in the N-type well region 14 and P-type well region 18. The decoder 64 and inverters 65 and 66 are formed in the N-type well region 12 and P-type well region 16.

Next, the operation of the above circuit is explained below. An analog input voltage applied to the input terminal 67 is compared, by means of the comparators COMP1 to COMP256, with potentials which are derived by dividing a potential difference between the reference potentials Vref1 and Vref2 by use of the resistors R0 to R256. The comparison results obtained by the comparators COMP1 to COMP256 are supplied to and latched by the latch circuits LA1 to LA256. Latch outputs of the latch circuits LA1 to LA256 are decoded by the decoder 64, converted to 8-bit digital data and output from the output terminal 68.

At the time of operation of the decoder 64, plurality bit of the 8-bit digital output are simultaneously changed, for example, and noise generated in the power source line is absorbed in the semiconductor substrate 10 and does no influence on the analog circuit formed in the well regions 14 and 18. Likewise, noise generated in the analog circuit section is absorbed in the semiconductor substrate 10 and does no influence on the digital circuit section.

Figure 4:
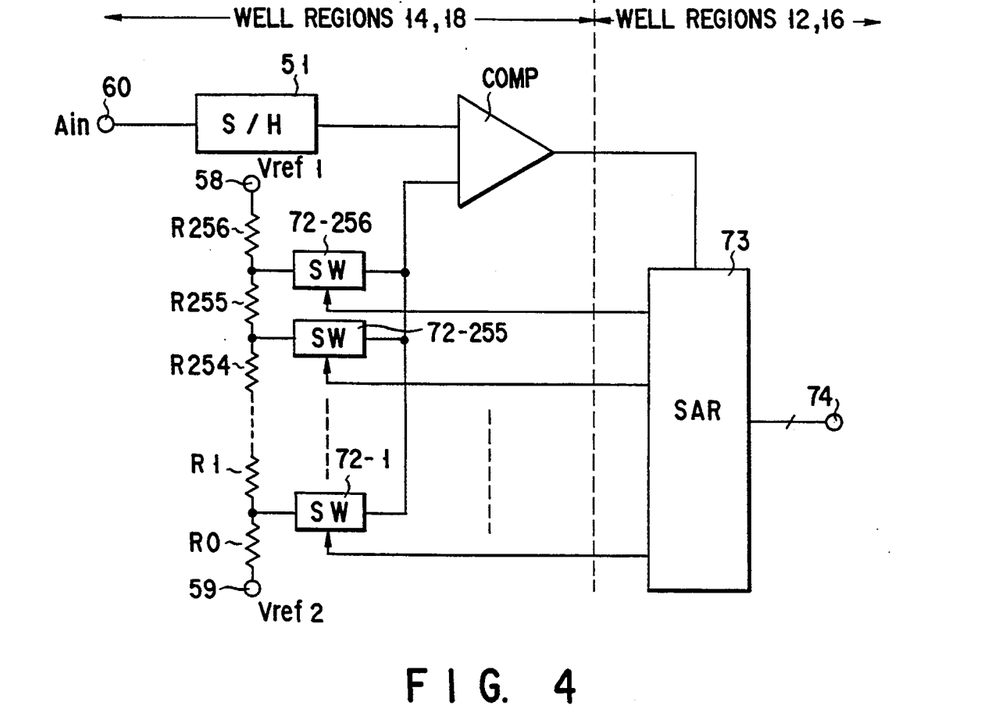
FIG. 4 is a circuit diagram showing another example of the construction of an analog/digital converter in the circuit shown in FIG. 2.

FIG. 4 shows another example of the construction of the analog/digital converter 52 in the circuit of FIG. 2 and shows the circuit construction of a successive approximation ADC. The ADC includes resistors R0 to R256, switches (SW) 71-1 to 71-256, comparators COMP and successive-approximation register control circuit (SAR) 73. The resistors R0 to R256 are serially connected between the terminals 58 and 59 to which reference potentials Vref1 and Vref2 are applied. One-side ends of the switches 71-1 to 71-256 are respectively connected to connection nodes between the resistors R0 and R2, ---, between the resistors R254 and R255 and between the resistors R255 and R256. The other side ends of the switches 71-1 to 71-256 are connected to one input terminal of the comparator COMP. The switching positions of the switches 71-1 to 71-256 are controlled by an output signal of the control circuit 73. The other input terminal of the comparator COMP is connected to an output terminal of the sample-and-hold circuit 51. The output terminal of the comparator COMP is connected to the control input terminal of the control circuit 73 and a digital signal corresponding to the analog input signal Ain is output from an output terminal 74 of the circuit 73.

The resistors R0 to R256, switches 72-1 to 72-256 and comparator COMP are formed in the N-type well region 14 and P-type well region 18. The control circuit 73 is formed in the N-type well region 12 and P-type well region 16.

In the ADC shown in FIG. 4, an analog input signal held in the sample-and-hold circuit 51 is compared with the potential at one end of a selected one of the switches 72-1 to 72-256 which is turned on. The switches are sequentially turned on by the control circuit 73 and the comparison operation is sequentially effected, and an 8-bit digital signal is output from the output terminal 74 of the control circuit 73 according to the comparison result.

Figure 5:
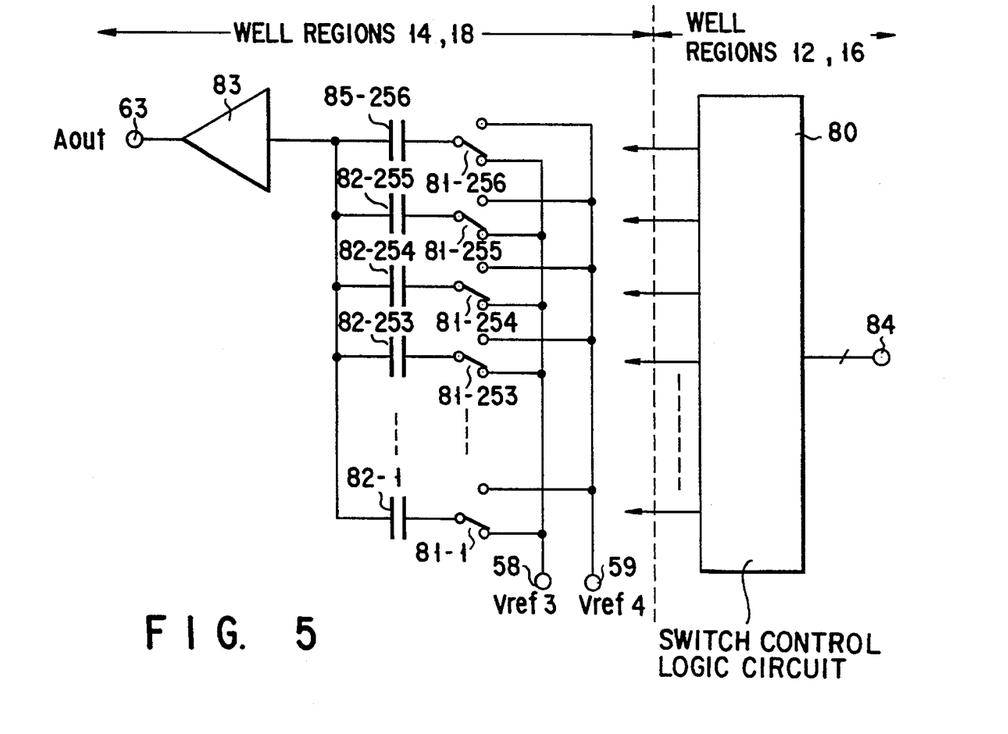
FIG. 5 is a circuit diagram showing an example of the construction of a digital/analog converter in the circuit shown in FIG. 2.

FIG. 5 is a circuit diagram showing an example of the construction of the digital/analog converter 54 in the circuit of FIG. 2. The DAC includes a switch control logic circuit 80, selection switches 81-1 to 81-256, capacitors 82-1 to 82-256, and buffer circuit 83. An input terminal 84 of the switch control logic circuit 80 is supplied with an 8-bit digital signal. The selection switches 81-1 to 81-256 are controlled by an output signal of the circuit 80. The selection switches 81-1 to 81-256 permit the reference potential Vref3 applied to the terminal 58 or the reference potential Vref4 applied to the terminal 59 to be selectively applied to one-side electrodes of the capacitors 81-1 to 81-256, respectively. The other side electrodes of the capacitors 82-1 to 82-256 are connected to an input terminal of the buffer circuit 83. The output terminal of the buffer circuit 83 is connected to an output terminal 63 for outputting an analog output signal Aout.

The switches 81-1 to 81-256, capacitors 82-1 to 82-256 and buffer circuit 83 are formed in the N-type well region 14 and P-type well region 18. The switch control logic circuit 80 is formed in the N-type well region 12 and P-type well region 16.

with the above construction, when an 8-bit digital signal is supplied to the input terminal 84, the switching positions of the selection switches 81-1 to 81-256 are set by the switch control logic circuit 80, thereby permitting the capacitors 82-1 to 82-256 to be charged or discharged so as to determine the potentials of the other side electrode of the capacitors 82-1 to 82-256. An analog output signal Aout corresponding to the input digital signal is output from the buffer circuit 83.

Figure 6:
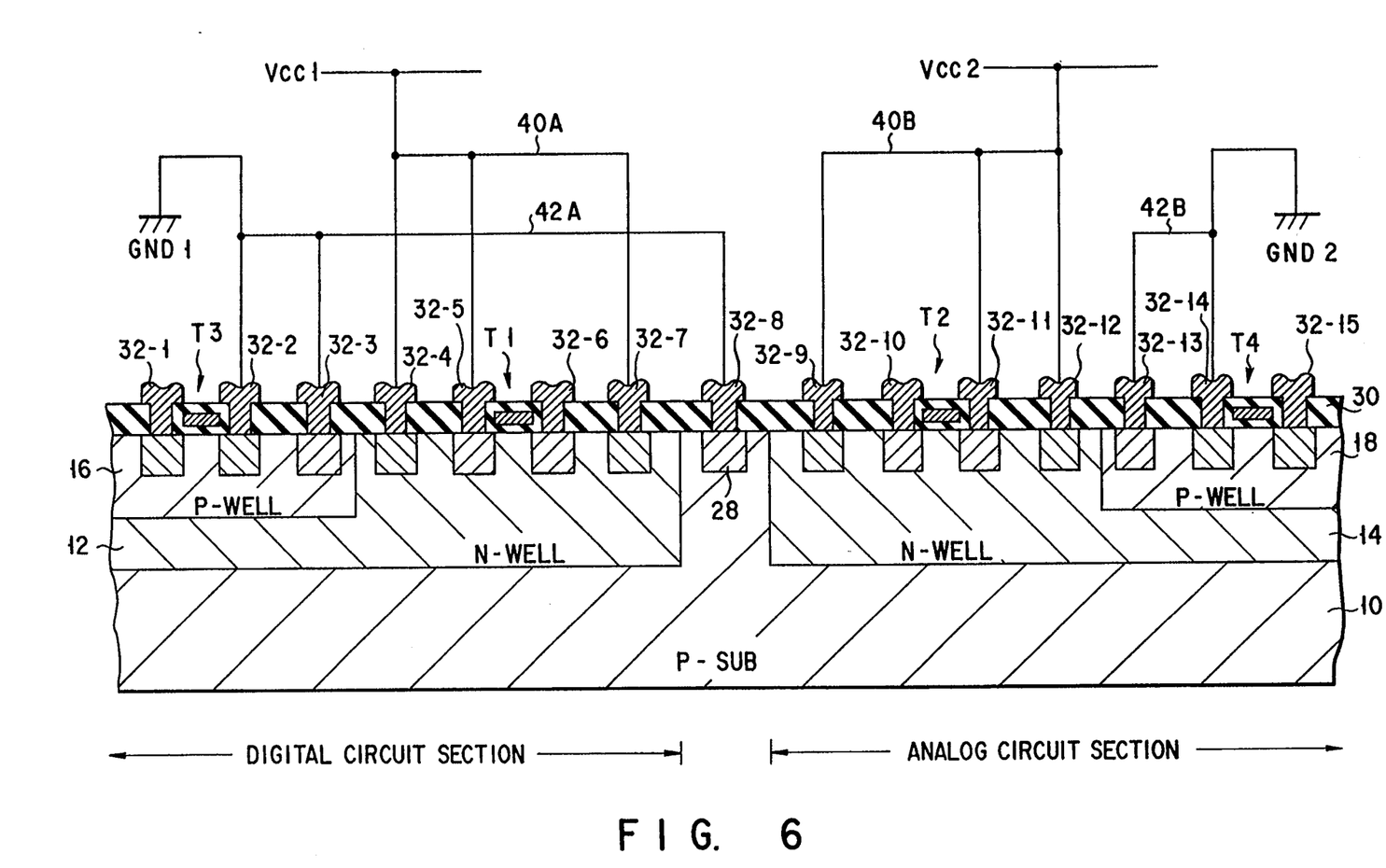
FIG. 6 is a cross sectional view showing the schematic construction of a semiconductor integrated circuit device according to a second embodiment of this invention.

FIG. 6 shows a semiconductor integrated circuit device according to a second embodiment of this invention and is a cross sectional view showing the schematic construction of a semiconductor integrated circuit device having an analog circuit and a digital circuit formed on one chip.

In the above device, the power source line 40 for the digital circuit section and analog circuit section in FIG. 1 is divided into two portions. That is, a power source line 40A for transmitting a power source voltage to the N-type well region (digital circuit section) 12 is connected to a first power source Vcc1 and a power source line 40B for transmitting a power source voltage to the N-type well region (analog circuit section) 14 is connected to a second power source Vcc2. Further, the power source line 42 for connecting the substrate 10 and the P-type well regions 16 and 18 to the ground terminal is divided into two portions for the digital circuit section and analog circuit section, a power source line 42A is connected to the first ground terminal GND1 and a power source line 42B is connected to the second ground terminal GND2.

Thus, if the power source lines are separately provided for the digital circuit section and the analog circuit section and the power sources are lead from different power source terminals, not only noise in the substrate but also noise transmitted via the power source line can be suppressed.

The power sources Vcc1 and Vcc2 may be different potentials or the same potential. Other reference potentials (at different potential levels or the same potential level) may be applied instead of the ground potentials GND1 and GND2. It is also possible to set the power source potentials Vcc1 and Vcc2 at the same potential level, set the ground potentials GND1 and GND2 at the same potential level and separately provide power source terminals (pads) of an LSI chip.

Figure 7:
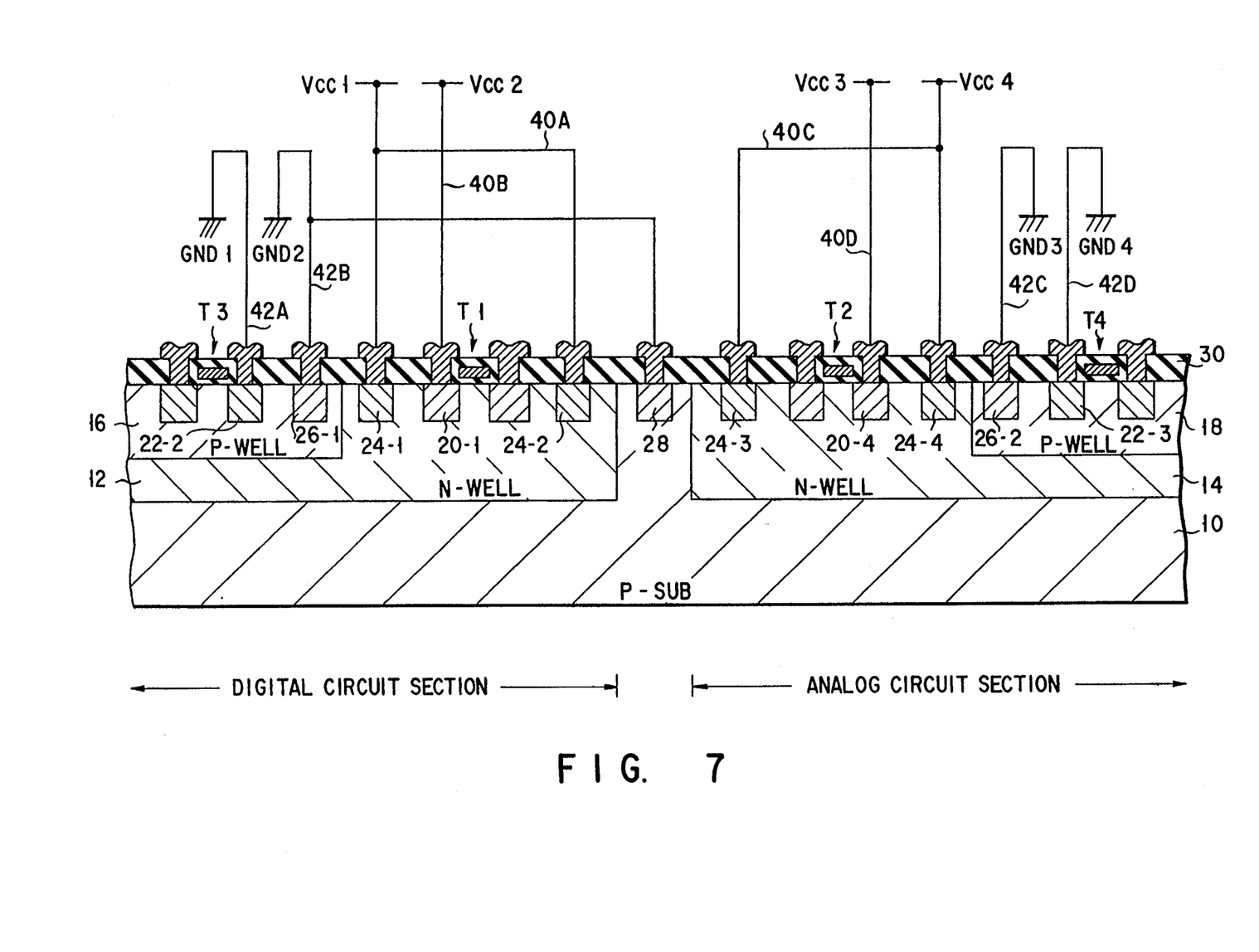
FIG. 7 is a cross sectional view showing the schematic construction of a semiconductor integrated circuit device according to a third embodiment of this invention.

FIG. 7 is a cross sectional view showing the schematic construction of a semiconductor integrated circuit device having an analog circuit device and a digital circuit device formed on one chip so as to illustrate a semiconductor integrated circuit device according to a third embodiment of this invention.

In the device of FIG. 7, the power source line 40 is divided as described above and the power source line for biasing the well regions 12 and 14 and the power source line for applying the power source voltage to the active elements are also divided. That is, in the digital circuit section, a power source line 40A for biasing the N-type well region 12 is connected to a power source Vcc1 and a P-type semiconductor region 20-1 formed in the N-type well region 12 is connected to a power source Vcc2 via a power source line 40B. Further, a power source line 42B for biasing a P-type well region 16 is connected to a ground terminal GND2 and an N-type semiconductor region 22-2 formed in the P-type well region 16 is connected to a ground terminal GND1 via a power source line 40A. Likewise, in the analog circuit section, P-type semiconductor regions 24-3 and 24-4 formed in the N-type well region 14 are connected to a power source Vcc4 via a power source line 40C and the P-type semiconductor region 20-4 is connected to a power source line Vcc3 via a power source line 40D. A P-type well region 18 is connected to GND3 by means of the power source line 42C and the N-type region 22-3 is connected to GND4 by means of the power source line 42D.

As described above, if the power source lines are separately provided for the digital circuit section and the analog circuit section and the power source line for biasing the well region and the circuit power source line connected to the region constituting the active element formed in the well region are separately provided, noise transmitted via the wiring can be more stably cut off than in the second embodiment.

This invention is not limited to the above-described embodiments and various modifications can be made. For example, the analog circuit section and the digital circuit section may be separately formed in first and second P-type well regions by respectively replacing the N and P conductivity types by the N and P conductivity types and forming the first and second P-type well regions in the N-type semiconductor substrate. With this construction, the same effect as that obtained in the above embodiments can be attained. Further, the locations of the various circuits in the semiconductor integrated circuit device shown in FIG. 2, the analog/digital converters shown in FIGS. 3 and 4, and in the digital/analog converter shown in FIG. 5 are not limited to those described above and shown in FIGS. 2 to 5. Any circuit can be formed in the well regions 12 and 16 or the well regions 14 and 18, in accordance with the functional requirements of the converter and/or the features of the system into which to incorporate the converter. In other words, the broken line shown in FIGS. 2 to 5 can be situated at any point other than shown in FIGS. 2 to 5. In addition, this invention can be modified without departing from the technical scope thereof.

What is claimed is:

1. A semiconductor integrated circuit device comprising:

a semiconductor substrate of a first conductivity type;

a first well region of a second conductivity type formed in said semiconductor substrate;

a second well region of the second conductivity type which is formed in said semiconductor substrate at a position separated from said first well region and in which an analog circuit comprising complementary metal oxide silicon transistors is formed; and bias means for biasing said semiconductor substrate by a constant potential, said bias means including a semiconductor region of the first conductivity type formed is that portion of said semiconductor substrate which lies between said first and second well regions and having an impurity concentration higher than said semiconductor substrate, a potential supplying source, and a power source line connected between said semiconductor region and said potential supplying source.

2. A semiconductor integrated circuit device comprising:

a semiconductor substrate of a first conductivity type;

a first well region of a second conductivity type formed in said semiconductor substrate;

a second well region of the second conductivity type which is formed in said semiconductor substrate at a position separated from said first well region and in which an analog circuit comprising complementary metal oxide silicon transistors is formed;

a third well region of the first conductivity type formed in said first well region and a fourth well region of the first conductivity type formed in said second well region; and first bias means for biasing said third well region by a constant potential and second bias means for biasing said fourth well region by a constant potential, said first bias means including a first semiconductor region of the first conductivity type formed in said third well region and having an impurity concentration higher than said third well region, a first potential supplying source, and a first power source line connected between said first potential supplying source and said first semiconductor region, and said second bias means including a second semiconductor region of the first conductivity type formed in said fourth well region and having an impurity concentration higher than said fourth well region, a second potential supplying source, and a second power source line connected between said second potential supplying source and said second semiconductor region.

3. A device according to claim 2, further comprising a third semiconductor region of the second conductivity type formed in said third well region and acting as part of an active element; a third potential supplying source; a third power source line connected between said third semiconductor region and said third potential supplying source; a fourth semiconductor region of the second conductivity type formed in said fourth well region and acting as part of an active element; a fourth potential supplying source; a fourth power source line connected between said fourth semiconductor region and said fourth potential supplying source.

4. A semiconductor integrated circuit device comprising:
a semiconductor substrate of a first conductivity type;
first bias means for biasing said semiconductor substrate by a constant potential;
a first well region of a second conductivity type formed in said semiconductor substrate, a digital circuit being formed in said first well region;
second bias means for biasing said first well region by a constant potential;
a second well region of the second conductivity type which is formed in said semiconductor substrate at a position separated from said first well region and in which an analog circuit comprising complementary metal oxide silicon transistors is formed; and
third bias means for biasing said second well region by a constant potential, wherein
said first bias means includes a first semiconductor region of the first conductivity type formed in that portion of said semiconductor substrate which lies between said first and second well regions and having an impurity concentration higher than that of said semiconductor substrate, a first potential supplying source, and a first power source line connected between said first potential supplying source and said first semiconductor region,
said second bias means includes a second semiconductor region of the second conductivity type formed in said first well region and having an impurity concentration higher than that of said first well region, a second potential supplying source, and a second power source line connected between said second potential supplying source and said second semiconductor region, and
said third bias means includes a third semiconductor region of the second conductivity type formed in said second well region and having an impurity concentration higher than that of said second well region, a third potential supplying source, and a third power source line connected between said third potential supplying source and said third semiconductor region.

5. A device according to claim 4, further comprising a fourth semiconductor region of the first conductivity type formed in said first well region and acting as part of an active element; a fourth potential supplying source; a fourth power source line connected between said fourth semiconductor region and said fourth potential supplying source; a fifth semiconductor region of the first conductivity type formed in said second well region and acting as part of an active element; a fifth potential supplying source; a fifth power source line connected between said fifth semiconductor region and said fifth potential supplying source.

6. A semiconductor integrated circuit device comprising;
a semiconductor substrate of a first conductivity type;
first bias means for biasing said semiconductor substrate by a constant potential;
a first well region of a second conductivity type formed in said semiconductor substrate, a digital circuit being formed in said first well region;
second bias means for biasing said first well region by a constant potential;
a second well region of the second conductivity type which is formed in said semiconductor substrate at a position separated from said first well region and in which an analog circuit comprising complementary metal oxide silicon transistors is formed;
third bias means for biasing said second well regions by a constant potential; and
a third well region of a first conductivity type formed in said first well region, fourth bias means for biasing said third well region by a constant potential, a fourth well region of the first conductivity type formed in said second well region, and fifth bias means for biasing said fourth well region by a constant potential, wherein
said fourth bias means includes a first semiconductor region of the first conductivity type formed in said third well region and having an impurity concentration higher than said third well region, a first potential supplying source, and a first power source line connected between said first potential supplying source and said first semiconductor region, and
said fifth bias means includes a second semiconductor region of the first conductivity type formed in said fourth well region and having an impurity concentration higher than said fourth well region, a second potential supplying source, and a second power source line connected between said second potential supplying source and said second semiconductor region.

7. A device according to claim 6, further comprising a third semiconductor region of the second conductivity type formed in said third well region and acting as part of an active element; a third potential supplying source; a third power source line connected between said third semiconductor region and said third potential supplying source; a fourth semiconductor region of the second conductivity type formed in said fourth well region and acting as part of an active element; a fourth potential supplying source; a fourth power source line connected between said fourth semiconductor region and said fourth potential supplying source.

* * * * *